United States Patent [19]
Wanlass

[11] Patent Number: 5,422,507
[45] Date of Patent: Jun. 6, 1995

[54] ELECTRICAL ISOLATION IN INTEGRATED CIRCUITS

[75] Inventor: Frank Wanlass, Sunnyvale, Calif.

[73] Assignee: Standard Microsystems Corporation, Hauppauge, N.Y.

[21] Appl. No.: 361,175

[22] Filed: Dec. 21, 1994

Related U.S. Application Data

[63] Continuation of Ser. No. 961,433, Oct. 15, 1992, abandoned.

[51] Int. Cl.$^6$ ............................................. H01L 27/02
[52] U.S. Cl. .................................. 257/355; 257/371; 257/373; 257/509
[58] Field of Search ............... 257/203, 355, 371, 509, 257/373

[56] References Cited

U.S. PATENT DOCUMENTS 3,865,654  2/1975  Chang et al. ..................... 257/371
4,336,489  6/1982  Frederiksen ...................... 257/355
4,476,476  10/1984 Yu et al. ............................ 257/359
4,647,956  3/1987  Shrivastava et al. .............. 257/373

FOREIGN PATENT DOCUMENTS 61-103317  5/1986  Japan .

Primary Examiner—J. Carroll
Attorney, Agent, or Firm—Hopgood, Calimafde, Kalil & Judlowe

[57] ABSTRACT

A back biasing technique is provided for increasing the field inversion voltage between adjacent MOS transistors and for reducing parasitic capacitances in an integrated circuit. The use of a charge pump is avoided by connecting the body portions of the MOS transistors to ground and the sources of the MOS transistors to the anode of a diode, the cathode of which are connected to a reference voltage such as to ground. In this manner, the sources are back biased relative to the material in which they are formed by a diode forward voltage drop. This technique is particularly applicable to CMOS circuits operating from a 3.3 volt supply, with p-well doping densities in excess of $1 \times 10^{17}$ atoms/cm$^3$.

29 Claims, 6 Drawing Sheets

ELECTRICAL ISOLATION IN INTEGRATED CIRCUITS

This application is a continuation of application Ser. No. 07/961,433, filed Oct. 15, 1992, abandoned.

BACKGROUND OF THE PRESENT INVENTION

1. Field of the Present Invention

The present invention relates to semiconductor integrated circuit (IC) devices, and, more particularly, to a simplified design and process for providing appropriate electrical isolation between adjacent transistors and reduced parasitic capacitances in such devices.

2. Description of the Prior Art

A continuing trend in the design of ICs, particularly CMOS ICs, is toward lower operating voltages, shorter channel lengths, and thinner gate dielectrics. For example, the presently standard 5 volt power supply for CMOS logic and memory circuits is being replaced by a 3.3 volt supply, and there are predictions that future ICs, with even shorter channel lengths, much less than 1.0 micron, will operate at 2 volts or less.

For CMOS ICs having effective channel lengths of about 1.0 micron or less, it is conventional to use a twin well approach, with both wells having a surface doping concentration in the range of $1 \times 10^{17}$ atoms/cm$^3$ to $4 \times 10^{17}$ atoms/cm$^3$, the lesser concentration being useful for effective channel lengths down to about 0.6 micron, and the greater concentration being useful for effective channel lengths, between about 0.6 micron and 0.3 micron. The nMOS transistors are fabricated in the P-doped well (p-well), and the pMOS transistors are fabricated in the N-doped well (n-well). Each p-well functions as a common body connection for all of the nMOS transistors in that p-well, and often is connected to the most negative supply voltage. Each n-well functions as a common body connection for all of the p-MOS transistors in that n-well, and often is connected to the most positive of the supply voltages.

Typically, the field oxide between adjacent transistors is at least 5000 Angstroms thick to avoid field inversion and provide good electrical isolation. In addition to this relatively thick oxide, it is common practice to selectively implant with boron those portions of the p-well silicon surface under the field oxide to even larger doping levels than the original p-well doping levels. These larger doping levels aid in achieving a sufficiently large field inversion voltage between adjacent nMOS transistors, to ensure adequate electrical isolation. This extra implant usually is necessary only for the p-well because a P-type surface tends toward inversion, whereas an N-type surface tends toward enhancement. As is well known, this tendency for a p-well surface to invert is primarily due to some amount of unavoidable Si-SiO$_2$ positive interface charge ($Q_{SS}$).

A principal disadvantage to the use of the extra boron implant, in addition to its cost and complexity, is that the source and drain junction sidewall capacitance, commonly termed one of the "parasitic capacitances," of the nMOS transistors is significantly increased, often to twice the amount such capacitance would otherwise be, as a result of the increased amount of doping. This extra capacitance causes substantial speed degradation in some products, such as memory chips with long bit lines. Another disadvantage is that the extra boron doping in the field region can diffuse sideways and reduce the effective channel width (W) of the active transistors.

In addition to the extra boron implant, many IC products use a negative back bias ($V_B$) applied to the p-well to increase the field inversion voltage between the nMOS transistors. Less boron field doping needs to be implanted if this is done. Another advantage of using the negative back bias is that the sidewall capacitances and other parasitic capacitances, such as the bottom capacitances, associated with the sources and drains, are reduced approximately in inverse proportion to the square root of the amount of applied back bias.

Typically, the negative back bias voltage is generated by a charge pump circuit integrated onto the same chip as the rest of the circuitry. As is well known, the charge pump circuitry typically operates between the power supply voltage and a ground reference voltage connected to the overall IC chip, and typically includes an oscillator and other circuitry to maintain a negative voltage on a capacitor (which alone occupies considerable silicon area). The thus-generated negative voltage is applied to the p-well. Inasmuch as the p-well typically is conductively die-attached to the IC package, the floor of the overall package (or IC housing) is thereby pumped approximately to that same negative voltage.

A principal disadvantage of using charge pumps is that they typically cannot supply very much current, which can be a serious problem for some of the newer processes with short channel lengths and large hot carrier-induced substrate current. Another disadvantage of the known on-chip charge pumps is that they consume chip area. This problem is more serious in ICs that use multiple charge pumps.

It has been conventional in CMOS processing to use the "LOCOS" process, in which the field oxide is grown while the active regions are masked against oxidation by a selectively formed coating of silicon nitride. The LOCOS process, without extra complicated refinements, has the disadvantage of field oxide encroachment into the active areas, which reduces the effective channel width (W) dimension of the active transistors. An additional disadvantage of the conventional LOCOS-based processes is that excess strain typically is induced in the silicon near the edges of the portions where the oxide growth is masked by the nitride. This strain is known to produce many dislocations in the crystalline material, which can reduce yield.

SUMMARY OF THE PRESENT INVENTION

In view of the aforementioned and other problems and disadvantages with prior design and process techniques for achieving adequate electrical isolation between adjacent component portions of an IC, it is an object of the present invention to provide an integrated circuit that reduces, or completely eliminates, the need for extra boron doping in the field regions associated with nMOS transistors.

It is a further object of the present invention to significantly reduce the junction sidewall capacitances and other parasitic capacitances of nMOS transistors in an integrated circuit device, particularly in CMOS ICs.

It is another object of the present invention to enable the use of thinner field oxides than were previously possible for given amounts of surface doping.

It is yet a further object of the present invention to eliminate the use of charge pumps for generating back bias voltages in integrated circuits.

It is still a further object of the present invention to increase integrated circuit process yield as a result of circuit designs which do not rely on LOCOS processing.

The aforementioned and other objects are achieved in accordance with this invention, in part as a result of a recognition that in contemporary and future ICs, only a relatively small amount of back bias voltage will be needed to ensure sufficient electrical isolation between adjacent devices and that, for at least the majority of the circuitry in most ICs, such back bias voltage advantageously can be provided simply by using the voltage drop of a forward biased diode. If it is necessary for particular portions of input/output circuitry to achieve voltage compatibility with adjacent ICs, separate conventional guard-ring isolation can be used for those portions of the circuitry.

In accordance with one embodiment of this invention, an IC having nMOS transistors formed in p-wells includes an internal circuit portion which includes the majority of the circuitry on the chip, and an input/output portion for receiving and sending electrical signal onto and from the chip and for receiving a power supply voltage and a ground reference voltage. The internal circuit portion includes a PN diode having its cathode coupled to the ground reference voltage and its anode coupled to the sources of the nMOS transistors whose sources would normally be tied to ground in conventional prior circuits. As a result, the internal circuit portion operates solely between the power supply voltage and another voltage which is at least one diode forward voltage drop above the ground reference voltage. The p-wells in which these nMOS transistors are formed (and consequently the body connections of these nMOS transistors) are connected directly to the ground voltage reference, with the result that an amount of back bias voltage equal to at least one diode forward voltage drop, e.g., about 0.5 volt, is thereby applied between the sources/drains of the nMOS transistors and the field regions surrounding those nMOS transistors.

IN THE DRAWINGS

The aforementioned and other features, characteristics and advantages, and the invention in general, will be better understood from the following detailed description, taken in conjunction with the accompanying drawings, in which.

Figure 7:
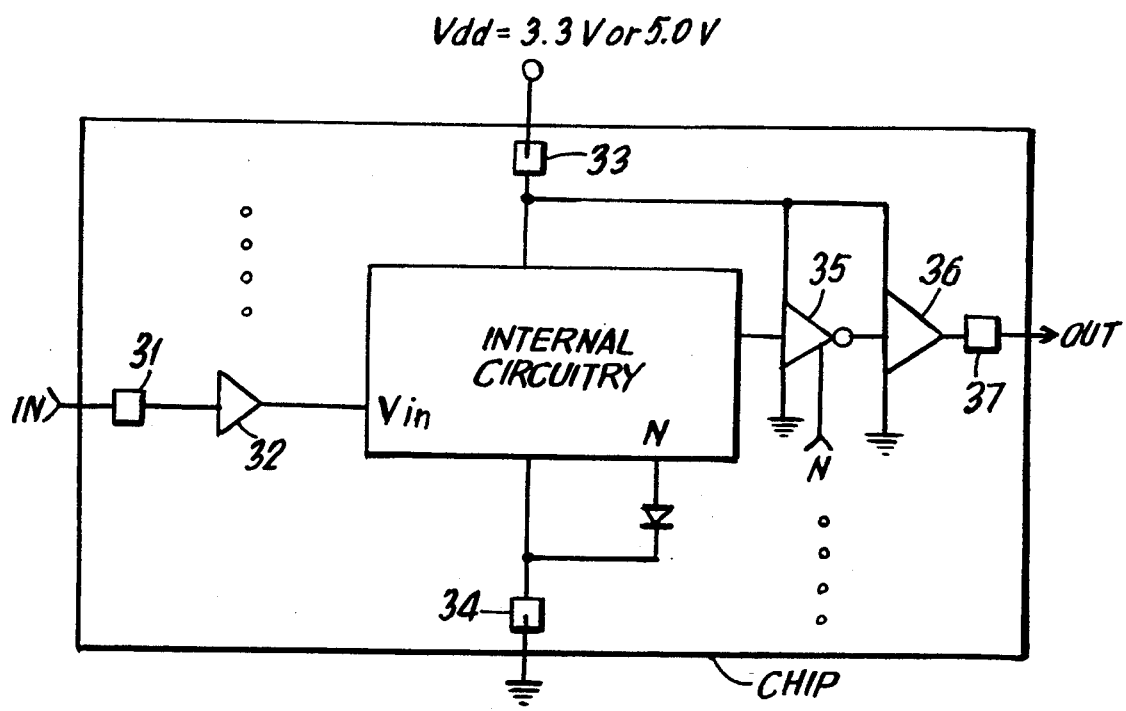
Figure 8:
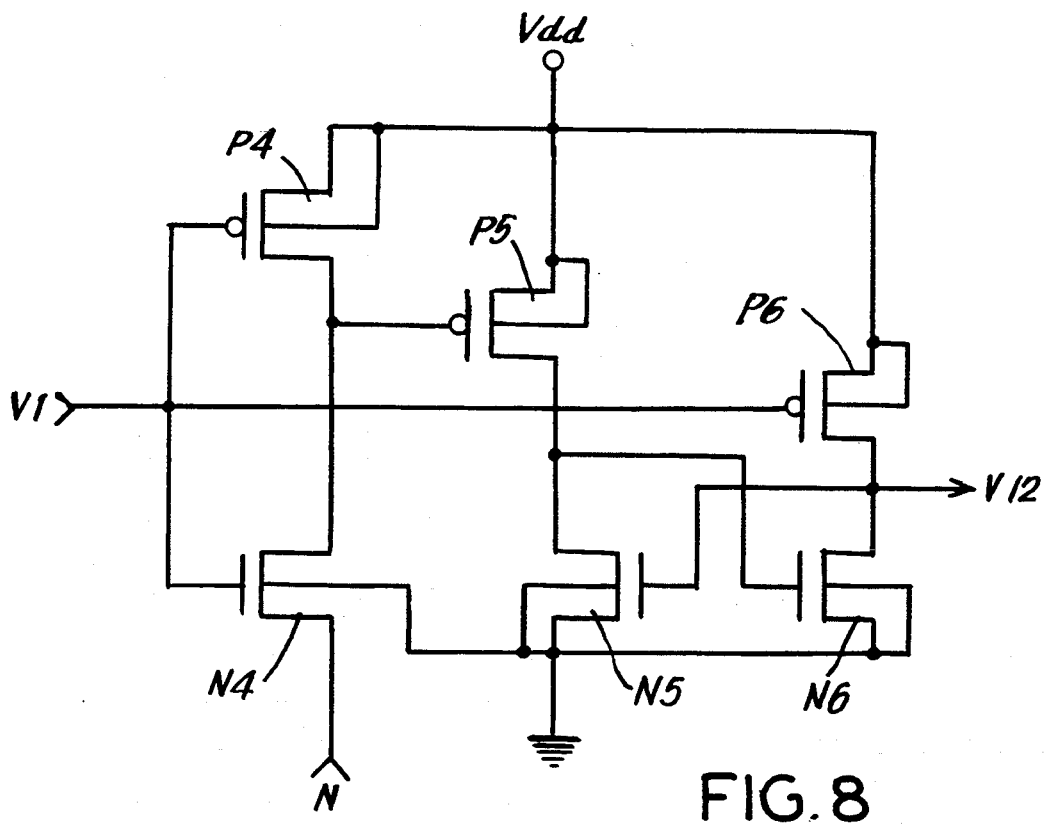

FIG. 7 is a schematic block diagram illustrating, from an overall aspect, the use of a diode forward voltage drop to provide back bias voltage for the internal portion of a complex IC in accordances with another embodiment of this invention; and FIG. 8 is a schematic circuit diagram of a level shifter for driving output circuitry, which can be used in an integrated circuit in accordance with this invention.

It will be appreciated that, for simplicity and clarity of explanation, reference numerals have been repeated as considered appropriate in the figures to indicate corresponding features, and that the figures have not necessarily been drawn to scale.

DETAILED DESCRIPTION OF THE INVENTION

With the advent of CMOS processes having p-well surface doping concentrations ($N_A$) of greater than about $1 \times 10^{17}$ atoms/cm$^3$, the field threshold voltage ($V_{TF}$) of the field regions surrounding the nMOS transistors becomes positive rather than negative, and only a relatively small amount of back bias is required to cause a further substantial positive shift in $V_{TF}$. These important observations will be better understood from the following analysis of the relevant quantitative relationships.

Without any back bias, according to Richman, (*MOS Field-Effect Transistors and Integrated Circuits*, authored by Paul Richman, published by John Wiley & Sons, New York, 1973, Eq. (2.44), p. 22 and Eq. (2.80), p. 37):

$$V_{TF} = (-Q_{SS} - Q_{SDmax})T_{OX}/\epsilon_{OX} + \phi_{MS} + 2\phi_F, \quad (1)$$

where: $Q_{SS}$ is the Si-SiO$_2$ positive interface charge in coulombs/cm$^2$;

$$Q_{SDmax} \approx -(4q\epsilon_S N_A \phi_F)^{\frac{1}{2}}; \quad (2)$$

$T_{OX}$ is the field oxide thickness, in cm; $\epsilon_{OX}$ is the dielectric constant of SiO$_2$; $\phi_{MS}$ is the metal to silicon work function difference; and $\phi_F$ is the Fermi potential. For Equation (2), q is the unit electron charge, in coulombs; $\epsilon_S$ is the dielectric constant of Silicon; $N_A$ is the acceptor concentration, in atoms/cm$^3$; and $\phi_F$ is again the Fermi potential.

As is well known, the Fermi potential is given by:

$$\phi_F = (kT/q)\ln(N_A/n_i), \quad (3)$$

where: k is Boltzmann's constant; T is the absolute temperature; and $n_i$ is the intrinsic carrier concentration. Throughout the following analyses, T will be taken as room temperature, i.e., 300 degrees Kelvin, and $n_i$ will be assumed to be $1 \times 10^{10}$ carriers/cm$^3$.

Figure 1:
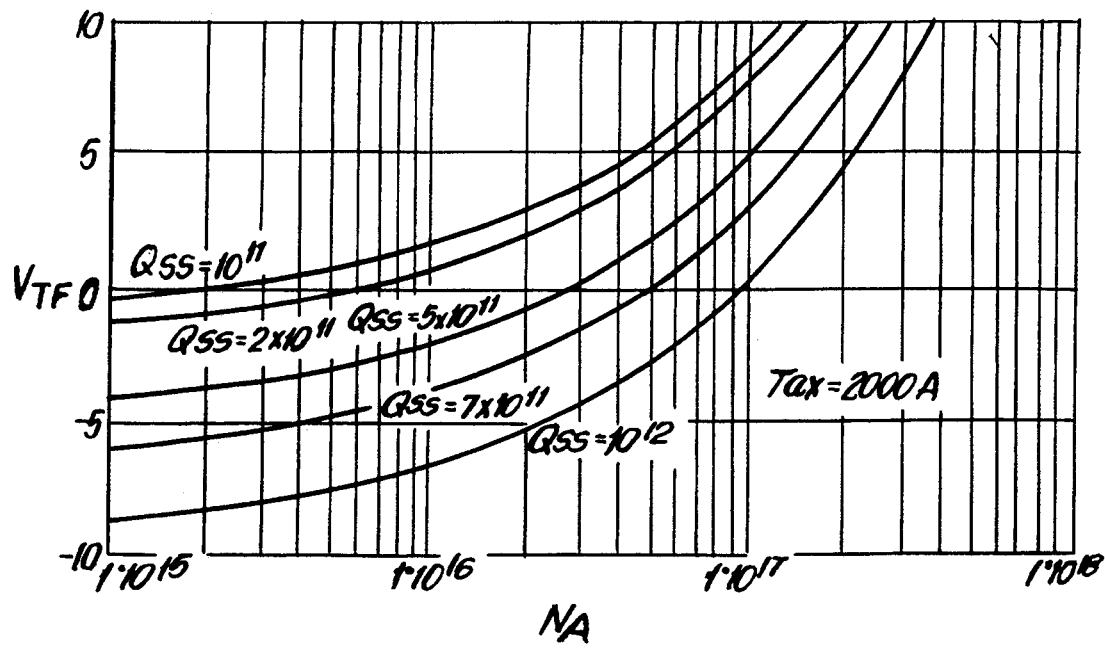
FIG. 1 is a graph depicting variation of field threshold voltage as a function of p-well doping for various amounts of positive interface charge ($Q_{SS}$)

FIG. 1 shows some curves generated using these equations, in particular showing $V_{TF}$ as a function of $N_A$, with $Q_{SS}$ as a parameter. For these curves, $T_{OX}$ was assumed to be 2000Å, and $\phi_{MS}$ was taken to be $-0.9$ volts, which is a typical number in contemporary processes. Among other things, these curves show that, for a field oxide thickness of 2000Å, $V_{TF}$ will be greater than about 3 volts if $N_A$ is $1 \times 10^{17}$ atoms/cm$^3$ and $Q_{SS}/q$ is less than $7 \times 10^{11}$/cm$^2$, which is thought to be a worst case number for typical contemporary processes. A more typical number for $Q_{SS}/q$ in ICs produced by contemporary processes is believed to be between about $2 \times 10^{11}/cm^2$ and $5 \times 10^{11}/cm^2$, which, as can be seen in FIG. 1, will produce a $V_{TF}$ of about 5-to-7 volts. Nevertheless, a field oxide inversion voltage of only 5-to-7 volts would not, for most purposes, provide an adequate safety margin against failure of electrical isolation in circuits operating at nominal 5 volts of applied power supply voltage.

However, if, in addition to the above, one applies a small amount of back bias, the $V_{TF}$ shift ($\delta V_{TF}$) as a function of applied back bias ($V_B$) is, according to Richman:

$$\delta V_{TF} = -Q_{SDmax} T_{OX} \{[(2\phi_F + V_B)/2\phi_F]^{\frac{1}{2}} - 1\}/\epsilon_{OX}. \quad (4)$$

Figure 2:
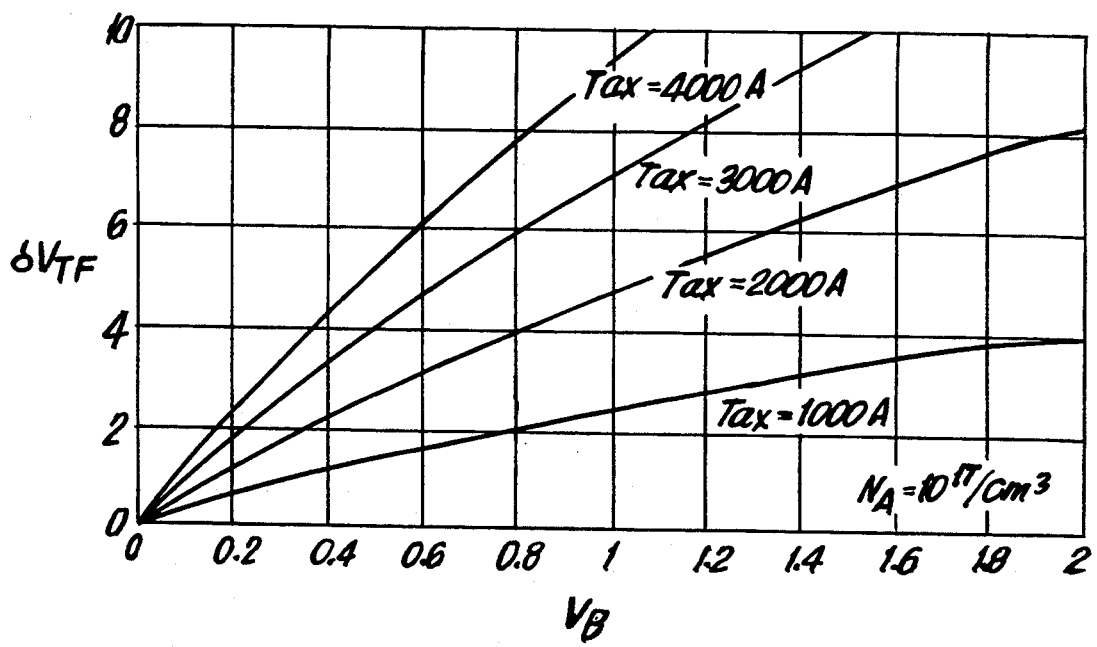
FIG. 2 is a graph depicting field threshold voltage shift as a function of back bias voltage for various field oxide thicknesses.
Figure 3:
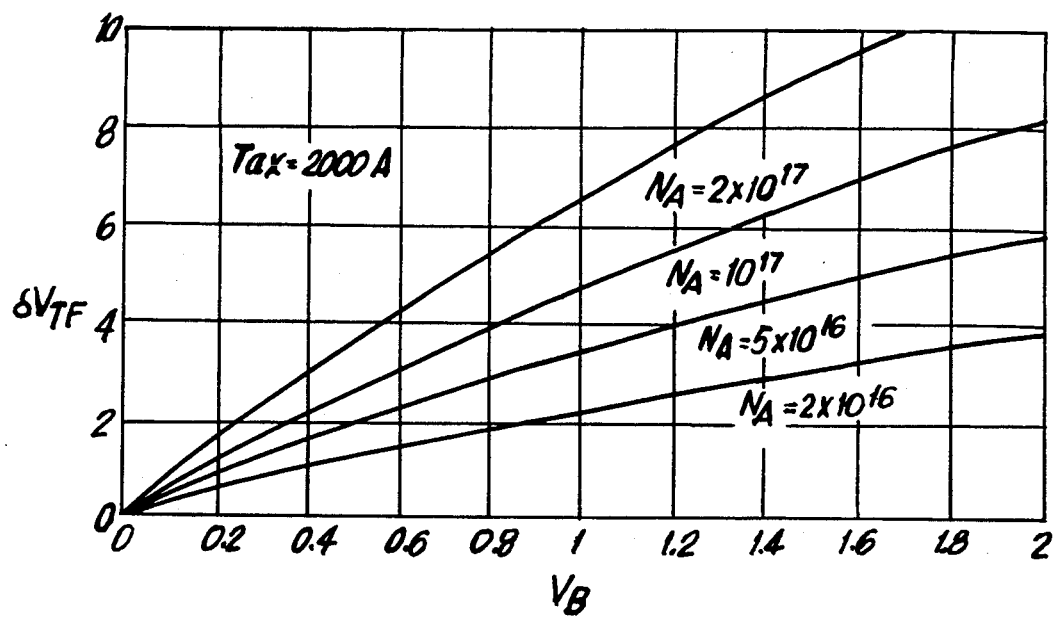
FIG. 3 is a graph depicting field threshold voltage shift as a function of back bias voltage for various amounts of doping in a p-well.

FIG. 2 shows some curves of $\delta V_{TF}$ as a function of $V_B$ for several different values of field oxide thickness ($T_{OX}$); and FIG. 3 shows curves of $\delta V_{TF}$ as a function of $V_B$ for several different values of $N_A$. These curves show that, for $T_{OX} = 2000$Å, and $N_A = 1 \times 10^{17}$, $\delta V_{TF}$ will be about 2.5 volts if $V_B$ is only about $-0.5$ volts.

This observation that only about $-0.5$ volts of applied back bias is required to produce an additional 2.5 volts of field inversion voltage can lead to a realization that, with only $-0.5$ volts of applied back bias, a total $V_{TF}$ of about 5.5 volts or greater can be achieved in typical contemporary processes which produce a basic field threshold voltage of about 3 volts or greater without applied back bias. And, a $V_{TF}$ of 5.5 volts is comfortably higher than the 3.3 volt supply voltage that is used for contemporary low voltage logic circuits.

Additionally, the curves in FIGS. 2 and 3 show that if $V_B$ is $-1.0$ volt, then a total $V_{TF}$ of 7.5 volts can be obtained, which should provide a safe margin for a 5 volt circuit. Still further, since $V_{TF}$ shift is approximately proportional to $T_{OX}$, according to FIG. 2, one can provide even more margin, if desired, simply by making the field oxide thicker than 2000Å.

From these considerations, it has been found that a simplified isolation scheme can be achieved through the use of a single diode forward voltage drop of approximately 0.5 volt to generate a back bias $V_B$ for the p-well containing the nMOS transistors. If more than 0.5 volts of back bias is desired, two or more diodes can be connected in series.

Figure 4:
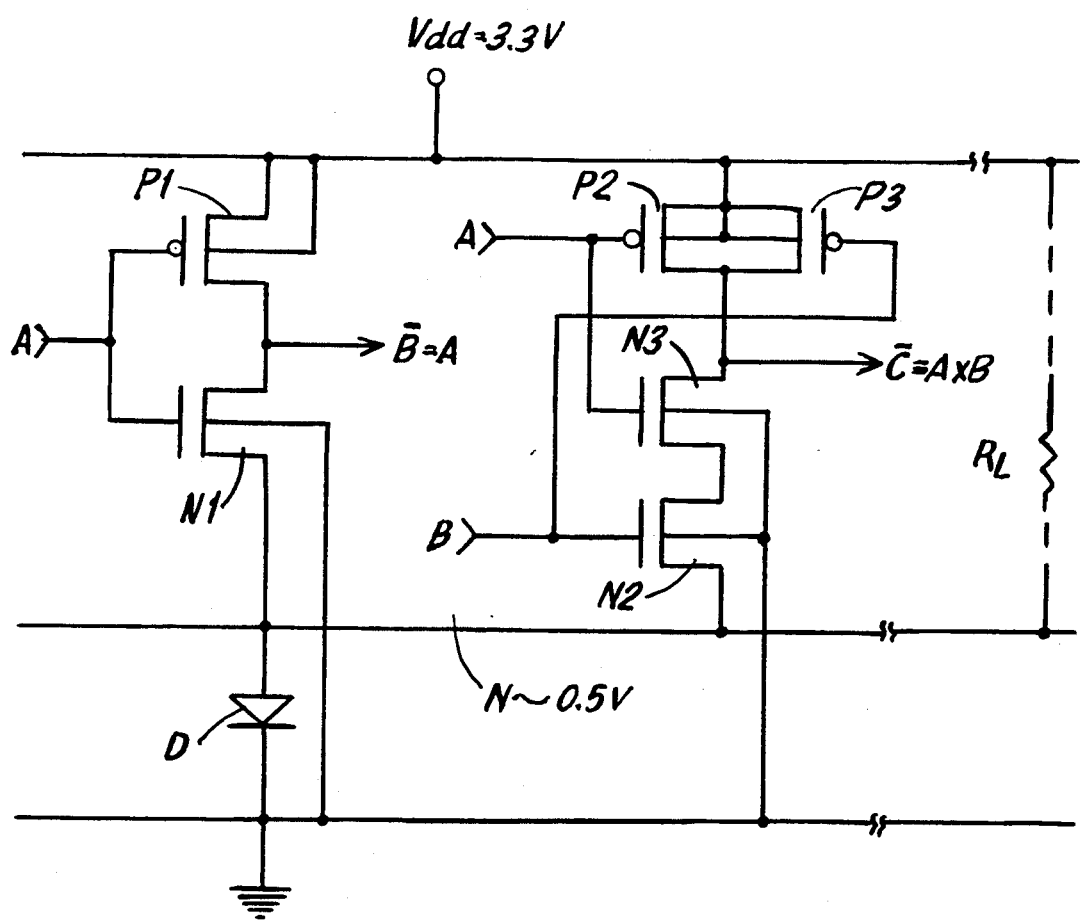
FIG. 4 is a schematic circuit diagram of an illustrative inverter and an illustrative NAND gate designed for a 3.3 volt power supply and using the back bias voltage provided by a single diode forward voltage drop in accordance with one embodiment of this invention.

FIG. 4 is a circuit diagram illustrating schematically the electrical connections which can be used for a simple inverter (comprising series-connected transistors N1 and P1) and a NAND gate (comprising transistors N2, N3, P2 and P3) implemented, in accordance with one embodiment of this invention, in the internal circuit portion of an IC chip using a 3.3 volt power supply (Vdd). For illustrative purposes, the nMOS transistors can be thought of as being formed in a single p-well and the pMOS transistors in a single n-well. As can be seen, the anode of a diode D is connected to a common node N, to which are connected all of the nMOS sources that would heretofore normally be connected to ground. The cathode of diode D is connected to a ground reference voltage. As will be appreciated, the inputs and the outputs of this inverter and NAND gate will swing between 0.5 volts and 3.3 volts.

Normal leakage currents, typically in the order of a few microamperes, and represented schematically as flowing through a phantom resistor $R_L$, will be sufficient to keep the diode D forward biased with a forward voltage drop of about 0.5 volts. If in any particular IC the normal leakage currents are insufficient to keep the diode forward biased by the desired amount, an additional separate resistor or other current-producing device can be employed.

As can be observed in the schematic circuit diagram of FIG. 4, it may not always be possible to connect all of the nMOS sources in the internal circuit portion of an IC to common node N. More specifically, for example, when a circuit portion requires series-connected nMOS transistors such as transistors N2 and N3, the source of nMOS transistor N3 cannot be connected to node N, but nevertheless is always at a voltage greater than the voltage of node N. As will also be observed in the schematic circuit diagram of FIG. 4, the body connections of all the nMOS transistors (N1, N2 and N3) advantageously are connected to the ground reference voltage and the body connections of all of the pMOS transistors (P1, P2 and P3) are connected to Vdd.

Although all nMOS sources which would normally be connected to the ground reference voltage may be thought of conceptually as sharing a single common node N, which is biased above the ground reference voltage by one or more diode forward voltage drops, it will be appreciated that for convenience and other reasons, the nMOS transistors may be formed in many separate p-wells, each of which is connected to the ground reference voltage. Further, if desired, such as for example, in a large complex chip, diode D can be replicated in parallel many times to make the electrical equivalent of one large diode having as small an impedance in the forward direction as may be desired.

Figure 5:
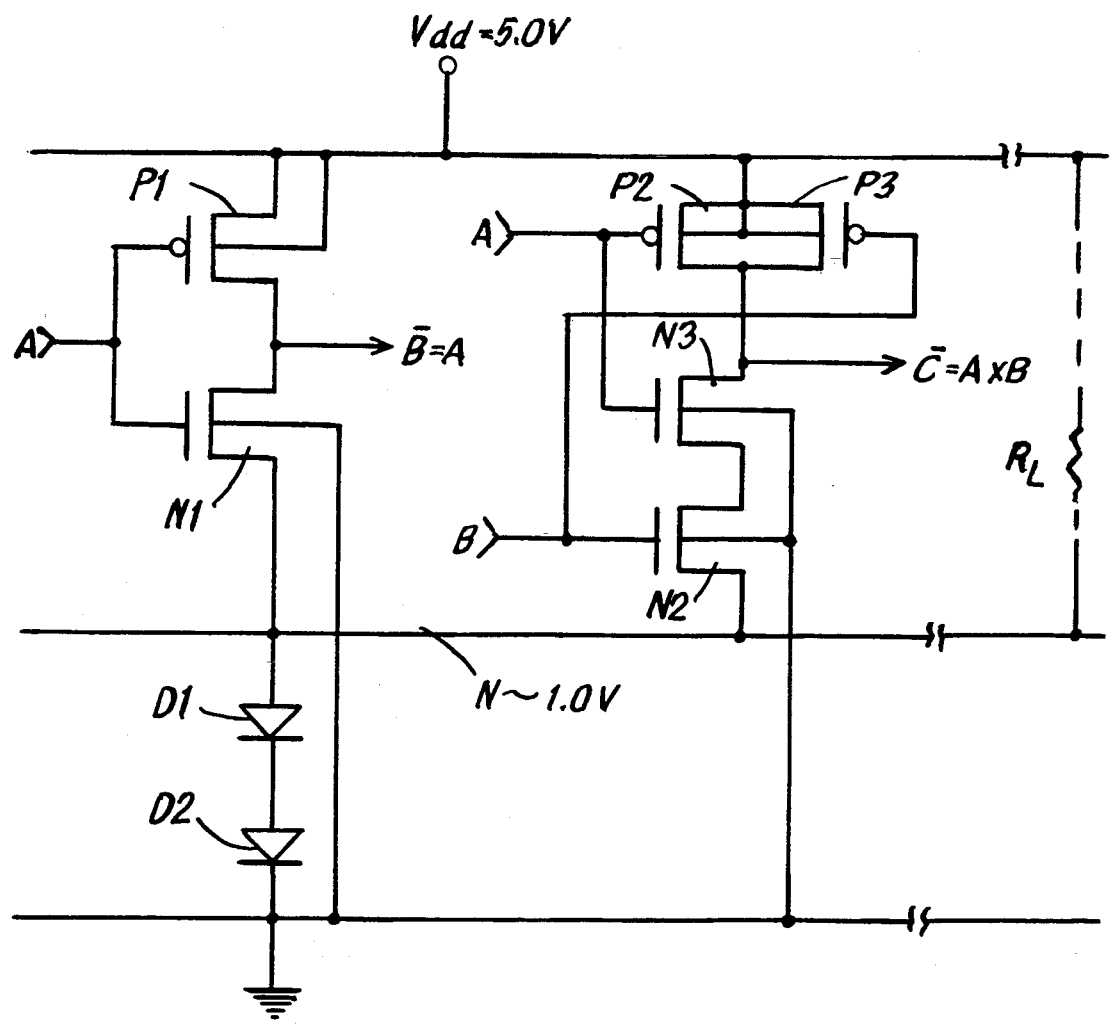
FIG. 5 is a schematic circuit diagram of a similar illustrative inverter and NAND gate, which are designed for use with a 5 volt supply and a back bias voltage provided by two diode forward voltage drops, in accordance with another embodiment of this invention.

The schematic circuit diagram of FIG. 5 illustrates the manner in which the simple inverter and NAND gate of FIG. 4 could be implemented using a 5 volt supply and two diodes in series between the nMOS sources and ground, to develop a back bias of two diode forward voltage drops, i.e, about 1 volt. In FIG. 5, diodes D1 and D2 are shown connected in series between common node N and the ground reference voltage, so that with an applied power supply voltage (Vdd) of 5 volts, common node N will normally be about 1 volt above ground.

Figure 6:
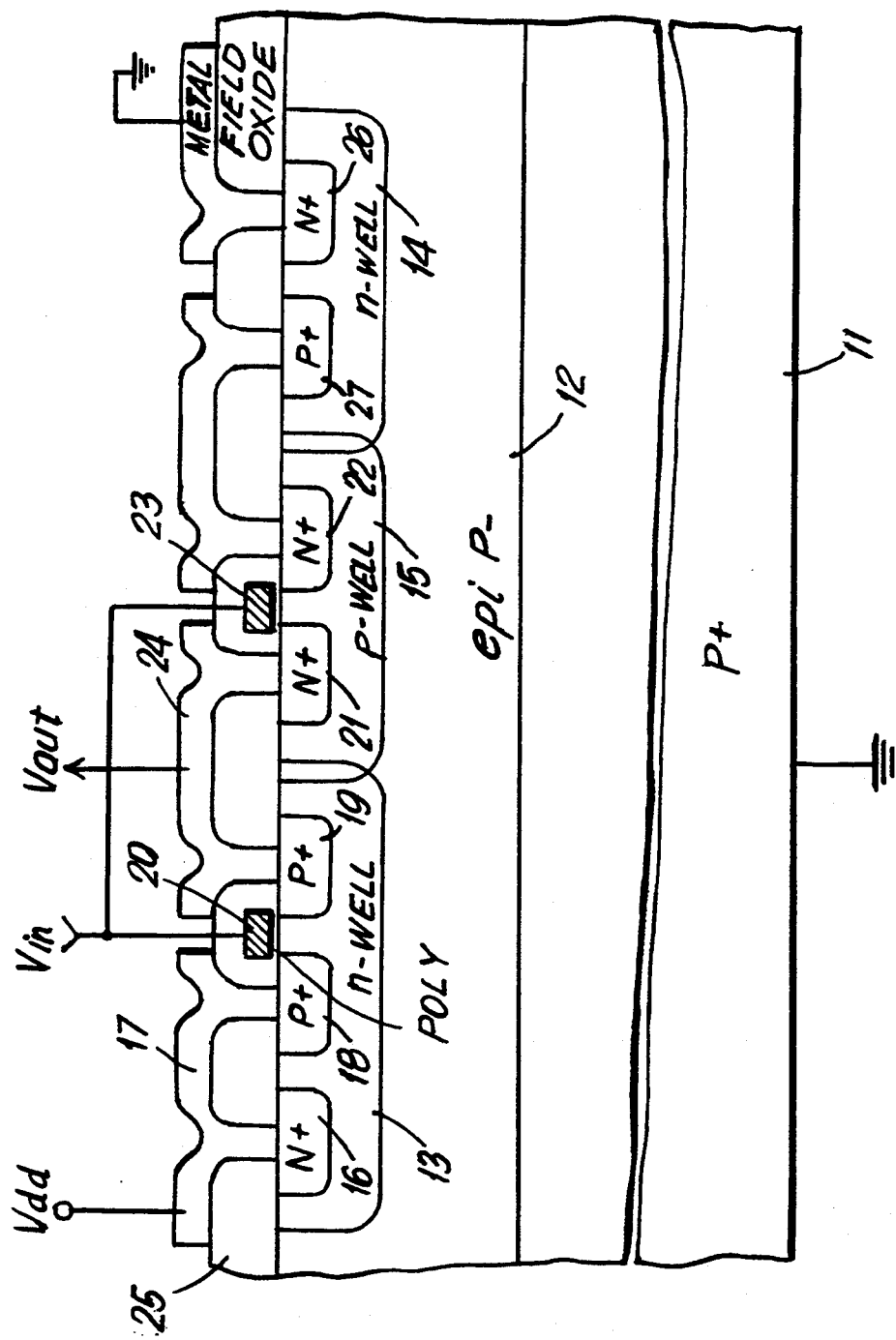
FIG. 6 is a cross-sectional view illustrating the manner in which a back bias diode can be implemented in a CMOS process in accordance with still another embodiment of this invention.

With reference now to FIG. 6, there is shown a cross-sectional view illustrating the manner in which a diode to provide back bias in accordance with an embodiment of this invention can be implemented in combination with an inverter of the type shown in FIG. 4 in the internal circuit portion of a twin well CMOS IC. As shown in FIG. 6, the IC includes a P+ substrate 11, which is connected to a ground reference voltage and which has a P− epitaxial layer 12 formed thereover. N-wells 13 and 14 and a p-well 15 are formed in layer 12 by the use of conventional processing techniques. An N+ zone 16 formed within n-well 13 provides a highly conductive connection of the well to Vdd through a metal overlay 17, which is also connected to the P+ source 18 of a pMOS transistor. P+ zone 19 is also formed in well 13 to provide the drain of the pMOS transistor (P1 in FIG. 4), which, as shown, may have a polycrystalline silicon gate 20. N+ zones 21 and 22 formed in the adjacent p-well 15 provide the drain and source, respectively, of an nMOS transistor (N1 in FIG. 4), which also has a polycrystalline gate 23. As shown schematically, the gates 20 and 23 are connected together and to Vin, as in FIG. 4. The drains 19 and 21 are connected together by a metal overlay 24 to Vout. A field oxide layer 25, typically of a thickness between about 2000 and 5000 Angstroms, is disposed over the silicon surface and underlies the metal overlays.

As shown in FIG. 6, n-well 14 includes an N+ zone 26 to provide a highly conductive connection for the ground reference voltage to zone 26. N-well 14 further includes a P+ zone 27, which forms the back bias diode D with the n-well. It will be appreciated that in operation, with applied Vdd and ground reference voltage, the source 22 of the nMOS transistor will be at a voltage of about one diode forward voltage drop, i.e., about 0.5 volts, thus back biasing the source and drain of that transistor by at least that amount with respect to the surrounding P-type material of the p-well, in accordance with this invention.

From the foregoing detailed description, it will be understood that the circuitry that uses the diode back biasing in accordance with this invention, which is likely to be the vast majority of the circuitry on any given chip, will have diminished signal swings that are offset by one or two diode forward voltage drops from the ground reference voltage. Accordingly, it will normally be necessary, or at least desirable, to provide some level shifting Input/Output (I/O) circuitry on such a chip. The I/O circuitry may be designed to operate without using a diode offset voltages simply by connecting the sources of the nMOS transistors involved with I/O directly to the ground reference voltage and implanting and/or diffusing field guard rings around these transistors, if necessary to ensure the avoidance of field inversion. Such guard rings consume some extra area, but the I/O circuitry is such a small fraction of the total chip area that this small extra area should not be significant. In addition, the guard rings do not require any extra process steps, as they can be formed simultaneously with the step which forms the P+ zones, such as 18 and 19, for the sources and drains of the pMOS transistors.

With reference now to FIG. 7, it will be seen that it is relatively easy to interface between the internal circuitry, which has the diode back biasing in accordance with this invention, and any desired or necessary input/output circuitry. As shown schematically in block diagram form in FIG. 7, a TTL-level input signal (IN) to the chip can be received at one or more terminals 31 and then can be translated through one or more conventional TTL-to-CMOS interface buffers 32 to provide the desired input signal Vin (swinging between Vdd and the ground reference voltage) for the internal portion of the circuitry. A particular, presently preferred, TTL-to-CMOS interface buffer for use in this regard is disclosed in the copending patent application, Ser. No. 07/835,207, filed Feb. 13, 1992, which has both a common inventor and common assignee with this application, now U.S. Pat. No. 5,216,299.

As is further shown in FIG. 7, the power supply Vdd and ground reference voltage are connected to the chip at terminals 33 and 34, respectively. As seen in FIG. 7, the full power supply voltage Vdd is coupled on the chip to an inverting level shifting circuit 35, which converts the diminished signal swings of the internal circuit portion to full voltage swings between Vdd and ground, and to a conventional CMOS-to-TTL level translating circuit 36 to provide conventional TTL-level output signals (OUT) at a terminal 37.

With reference now to FIG. 8, there is shown a schematic circuit diagram of an illustrative, simple inverting level shifter circuit suitable for use with the diminished signal swings available from the internal circuit portion of a chip employing diode back biasing in accordance with this invention. This level shifter circuit converts a signal swing that does not go all the way to ground to a signal swing that does go all the way to ground, without drawing any significant standby current.

As can be seen in FIG. 8, the level shifter circuit receives input signals V1 from the internal circuit portion and provides output signals V2 (having full Vdd to ground signal swings) to the CMOS-to-TTL level translator shown in FIG. 7. The level shifter circuit is a simple three-stage circuit including series-connected transistors N4 and P4, wherein the source of transistor N4 is connected to the common node N (from FIG. 4), series-connected transistors N5 and P5 and series-connected transistors N6 and P6. The input voltage V1 is connected both to the common gates of input transistors N4 and P4 and to the gate of output transistor P6. In operation, if input V1 is at a logic HIGH level, transistors P4 and P6 are held OFF, but transistor N4 is ON, thus turning ON transistor P5, which pulls the gate of transistor N6 toward transister N6. This turns on Vdd and pulls V2 to ground, i.e., to a logic LOW level. Alternatively, if input V1 is at a LOW level, transistor N4 is OFF and transistor P6 is ON, which pulls V2 to Vdd, i.e., to a logic HIGH. In this level shifter, the width-to-length ratio (W/L) of transistor P4 should preferably be about twice the W/L of transistor N4, the W/L of transistor P5 should be about six times the W/L of transistor N5, and the W/L of transistor P6 should be about six times the W/L of transistor N6, to enable the pMOS transistors to quickly pull up their series-connected nMOS transistors when necessary. Further, it will be understood by those skilled in the art that the described level shifter circuit could be made to be non-inverting, if desired, by taking the output from the common node between transistors P5 and N5, rather than from the common node between transistors P6 and N6.

As indicated above, it is often desirable to avoid LOCOS processing when feasible, for a number of reasons. The diode biasing in accordance with this invention can be provided in the following manner without LOCOS processing. The wafer surface is initially stripped of all oxide after the twin wells are formed by standard techniques. Then, oxide is vapor deposited to a thickness of 2000Å to 4000Å, and the deposited oxide may then be densified by the use of a conventional technique. After densification of the oxide, openings in the oxide are etched for active regions, preferably with some side wall slope, as is well known, and then any punch-through or threshold implants that may be desired are performed. Thereafter, a thin gate oxide is grown and the process proceeds as normal to complete the fabrication of the chip, with care taken to minimize high temperature steps, thereby minimizing any boron segregation into the field oxide.

Although the present invention has been described in part by making detailed reference to the specific presently preferred embodiments, such detail is intended to be and will be understood to be instructive rather than restrictive. It will be appreciated by those in the art that many variations may be made in the structure and mode of operation without departing from the spirit and scope of the invention as disclosed in the teachings contained herein. For example, the invention is not limited to CMOS ICs having twin wells, but can be employed to equal advantage in other types of ICs, such as those having only a single well formed in a substrate of opposite type conductivity.

Further, although the foregoing description has been primarily in terms of using a PN diode, because of the ease of fabrication and the fact that PN diodes have larger forward voltage drops than many Schottky barrier or other types of diodes, it will be appreciated that the use of any type of diode to provide the back bias is intended to be within the scope of this invention.

Still further, it will be appreciated that, although the detailed description of the integrated circuit of this invention has been primarily in terms of employing diode back biasing to provide appropriate field inversion voltage for suitable electrical isolation, the scope of the invention is not so limited. For example, as alluded to above, in contemporary and future ICs designed to have, among other features, short channel lengths and reduced power supply voltages, the field inversion voltage may be sufficient to provide adequate electrical isolation between adjacent components without any applied back bias. Nevertheless, in such ICs, diode back biasing in accordance with this invention can still advantageously be used, without undue additional cost or complexity, to provide reduced parasitic capacitances, as will as still further electrical isolation noise margins in operation.

Still further, it will be appreciated that, although the detailed description of the integrated circuit of this invention has been primarily in terms of employing diode back biasing to provide appropriate field inversion voltage for suitable electrical isolation between adjacent nMOS transistors in a P-type region such as a p-well, the scope of the invention is not so limited. For example, if additional field inversion voltage protection is desired between adjacent pMOS transistors in an N-type region, diode back biasing can be used for that purpose, as well. In such situations, as will be understood by those in the art, the back biasing diode, or series-connected diodes, could be disposed between the sources of the pMOS transistors and the positive supply voltage, and could be formed, for example, in a p-well.

The scope of the invention is set forth in the following claims.

What is claimed is:

1. An integrated circuit device including a back biasing circuit for a plurality of nMOS transistors, each including a source, a drain and a body portion and surrounded by a field region, said back-biasing circuit including a diode having a cathode and an anode, the body connections of said plurality of nMOS transistors being coupled to a reference voltage, the sources of said nMOS transistors being coupled to the anode of said diode, the cathode of said diode being coupled to the reference voltage, wherein leakage currents in the integrated circuit device are sufficient, in response to an applied power supply, to provide sufficient forward current flow through said diode to keep its anode at approximately 0.5 volts or greater, than its cathode, and whereby a back bias of approximately 0.5 volts or greater is established between the sources of said MOS transistors and the surrounding field region, thereby to increase the field inversion voltage in said field region and provide increased electrical isolation between adjacent ones of said second plurality of nMOS transistors.

2. The integrated circuit device of claim 1, wherein said diode is a silicon PN diode.

3. The integrated circuit device of claim 2, in which the reference voltage is ground.

4. The integrated circuit device of claim 3, wherein each nMOS transistor is disposed in a p-well that is the body of the transistor and which is doped sufficiently such that a body-to-source back bias of −0.5 volts causes a field threshold increase of approximately 2 volts or greater, for a field oxide thickness of 2000Å.

5. The integrated circuit device of claim 4, wherein the body of said nMOS transistors includes a p-well-doped to a concentration of between $5 \times 10^{16}$ and $5 \times 10^{17}$ atoms/cm$^3$.

6. The integrated circuit device of claim 5, wherein the field inversion voltage surrounding said nMOS transistors is greater than 4 volts for a body-to-source back bias of 0.5 volts.

7. The integrated circuit device of claim 6, further including at least one additional diode in parallel with said first-mentioned diode, both of said diodes being operatively connected to supply a positive source voltage to two or more of said nMOS transistors with common sources.

8. The device of claim 3, further including at least one nMOS transistor operatively connected as a portion of a series/parallel network of nMOS transistors in which the source of said at least one of said nMOS transistor is not connected directly to the anode of the diode, and the sources of said nMOS transistors that would normally be connected to ground are connected to said anode.

9. The integrated circuit device of claim 3, further including a second diode operatively connected in series with the first-mentioned diode such that the sources of the nMOS transistors are maintained at approximately at least two diode forward voltage drops above the ground reference voltage.

10. The integrated circuit device of claim 9, wherein the body of the nMOS transistor including a p-well is doped sufficiently that a body-to-source back bias of −1.0 volts causes a field threshold increase of approximately 4 volts or greater, for a field oxide thickness of 2000Å.

11. An integrated circuit device formed on a semiconductor chip including a first plurality of nMOS transistors which are electrically isolated from one another and comprising:

an internal circuit portion including a second plurality of nMOS transistors, each having a source and a drain, included within said first plurality of nMOS transistors;

a field region surrounding each of said second plurality of nMOS transistors; and an input/output portion for receiving and sending electrical signals onto and from the chip and for receiving a power supply voltage and a reference voltage onto the chip;

said internal circuit portion including means for increasing the field inversion voltage in said field region, said field inversion voltage increasing means including means for applying a relatively low back bias voltage between the sources of said second plurality of nMOS transistors and said surrounding field region, said bias-voltage applying means including a controllable conductive device having a forward voltage drop and including a first terminal for connection to the reference voltage and a second terminal coupled to the sources of said second plurality of MOS transistors that would normally be coupled to the reference voltage, whereby said internal circuit portion is caused to operate between the positive power supply voltage and another voltage which is at least one said forward voltage drop above the reference voltage.

12. The integrated circuit device as claimed in claim 11, in which said controllable conductive means comprises a diode having a cathode for connection to the reference voltage and an anode coupled to said sources of said second plurality of nMOS transistors.

13. The integrated circuit device of claim 12, in which the reference voltage is ground.

14. The integrated circuit device as recited in claim 11, wherein the majority of the circuitry on the chip is included in said internal circuit portion.

15. The integrated circuit device as recited in claim 13, further including a second diode coupled in series with the first diode between the sources of said second plurality of nMOS transistor and the reference voltage.

16. The integrated circuit device as recited in claim 15, wherein said first diode and said second diode are each PN diodes.

17. The integrated circuit device as recited in claim 11, wherein said second plurality of nMOS transistors are formed in one or more p-wells, each of which is coupled to the reference voltage.

18. The integrated circuit device as recited in claim 15, further including at least one nMOS transistor having a source not connected to the anode of said diode, but which is operatively connected in the circuit such that, in operation, its source and drain are maintained at a voltage level at least as great as the voltage level of the anode of said diode.

19. The integrated circuit device as recited in claim 11, further including level shifting circuitry to provide voltage compatibility with other integrated circuit devices.

20. The integrated circuit device as recited in claim 17, wherein the device is a CMOS device which further includes a plurality of pMOS transistors.

21. The integrated circuit device as recited in claim 17, wherein the device is a CMOS device which further includes a plurality of pMOS transistors in the internal circuit portion, and which further includes a second diode having the anode thereof coupled to a terminal adapted for connection to the power supply voltage and the cathode thereof coupled to the sources of the pMOS transistors that would normally be coupled to the power supply voltage, such that, with a power supply voltage and ground reference voltage applied to the chip, the internal circuit portion operates between a first voltage, which is at least one diode forward voltage drop below the power supply voltage, and another voltage, which is at least one diode forward voltage drop above the ground reference voltage.

22. The integrated circuit device as recited in claim 21, wherein the pMOS transistors in said internal circuit portion are formed in one or more n-wells, each of which is electrically coupled for connection to the power supply voltage.

23. An integrated circuit device formed on a semiconductor chip including a first plurality of pMOS transistors which are electrically isolated from one another and comprising:
an internal circuit portion including a second plurality of pMOS transistors, each having a source and a drain, included within said first plurality of pMOS transistors;
a field region surrounding each of said second plurality of pMOS transistors;
an input/output portion for receiving and sending electrical signals onto and from the chip and for receiving a power supply voltage and a reference voltage onto the chip;
said internal circuit including means for increasing the field inversion voltage in said field region, said field inversion voltage increasing means including means for applying a relatively low back-bias voltage between the sources of said second plurality of pMOS transistors and said surrounding field region, said bias voltage applying means including a controllable conductive means having a forward voltage drop and including a first terminal for connection to the reference voltage and a second terminal coupled to the sources of said second plurality of pMOS transistors that would normally be coupled to the power supply voltage, whereby said internal circuit portion is caused to operate between the power supply voltage and another voltage which is at least one said forward voltage drop below the power supply voltage.

24. The integrated circuit of claim 23, in which said reference voltage is ground.

25. The integrated circuit of claim 24, in which said controllable conductive means comprises a diode.

26. A method of providing improved electrical isolation between adjacent nMOS transistors, each having a source, a drain and a body portion, and each being formed in an integrated circuit device, said method comprising the steps of:
disposing a diode between a reference voltage and the sources of the nMOS transistors that would normally be coupled to the reference voltage, such that the cathode of said diode is coupled to the reference voltage and the anode of said diode is coupled to the sources of said nMOS transistors;
applying a reference voltage to the body portion and to the cathode of the diode; and
applying to the integrated circuit device a power supply voltage of a polarity to cause the voltage on the drains of the MOS transistors to be more positive than the sources thereof by an amount sufficient to cause leakage currents through the transistors in an amount sufficient to cause the diode to be forward biased, thereby producing a relatively low back bias between both the sources of the MOS transistors and the body portion and the drains of the MOS transistors and the body portion, whereby a relatively large increase is achieved in the field inversion voltage, thereby to achieve an increased electrical isolation between adjacent ones of said nMOS transistors.

27. The method of claim 26, in which the reference voltage is ground.

28. The method of claim 27, in which said diode is a PN diode.

29. A CMOS integrated circuit comprising a p-type substrate, a first N-well diffused into said substrate, a p-well diffused in said substrate, a PMOS transistors formed in said N-well, at least one NMOS transistor formed in said p-well, means for operatively electrically connecting said p-type substrate to a reference potential, a second n-well in said substrate, means for operatively electrically connecting said first n-well to a source of positive potential, and at least one PN diode in said second n-well, the source of said at least one of said NMOS transistors being connected to ground through said PN diode, the anode of said PN diode being connected to the source of said at least one NMOS transistor, and the cathode of said PN diode being connected to ground, whereby the forward voltage drop in said PN diode causes a relatively low back bias voltage to be applied between the source of said NMOS transistor and said substrate, thereby to produce a relatively large increase in the field inversion voltage in the substrate adjacent said NMOS transistor.

* * * * *